United States Patent
Sexauer et al.

(10) Patent No.: US 7,433,477 B2
(45) Date of Patent: Oct. 7, 2008

(54) AUDIO SUPERPOSITIONING

(75) Inventors: Edgar Sexauer, Stuttgart (DE); Klaus Graef, Kirchheim (DE)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 682 days.

(21) Appl. No.: 10/135,044

(22) Filed: Apr. 30, 2002

(65) Prior Publication Data

US 2003/0194101 A1 Oct. 16, 2003

(30) Foreign Application Priority Data

Apr. 16, 2002 (EP) .................................. 02368040

(51) Int. Cl.
H04B 1/00 (2006.01)
(52) U.S. Cl. ...................... 381/119; 381/120
(58) Field of Classification Search ................. 381/119, 381/120
See application file for complete search history.

(56) References Cited

U.S. PATENT DOCUMENTS

| | | | | |
|---|---|---|---|---|
| 4,201,895 A * | 5/1980 | Hill, Jr. | ........................... | 369/4 |
| 5,541,543 A | 7/1996 | Arnaud | ........................ | 327/175 |
| 5,894,212 A | 4/1999 | Balogh | ........................ | 320/122 |
| 5,946,608 A | 8/1999 | Morita et al. | ................ | 455/334 |
| 6,147,558 A | 11/2000 | Sculley | ........................ | 330/284 |
| 6,404,892 B1 * | 6/2002 | Heyl | ........................... | 381/119 |

OTHER PUBLICATIONS

U.S. Patent Application to Klaus Graef and Edgar Sexauer, U.S. Appl. No. 09/995,195, filed Nov. 27, 2001, "Combine Audio and Ringing Mode".

* cited by examiner

*Primary Examiner*—Alexander Jamal
(74) *Attorney, Agent, or Firm*—Saile Ackerman LLC; Stephen B. Ackerman

(57) ABSTRACT

A circuit, which is enabling the superpositioning of different audio signals such as voice, music or ringer signals in a audio output device is achieved. The individual superpositioning can be activated and performed by a combination of resistors and switches without the need of an additional mixing amplifier as in prior art. One common output stage is used for all the signals activated and superpositioned. The adjustment of the amplitude of the output signal, which can be used for the volume adjustment of a loudspeaker, is provided by a precise amplitude setting via the gain control stages of an inverting voltage amplifier through a current-voltage conversion. Said current-voltage conversion is performed by a string of resistors activated by a string of correspondent switches. This circuit reduces the power consumption, the chip area required and the offset and improves the power supply rejection rate (PSSR).

15 Claims, 2 Drawing Sheets

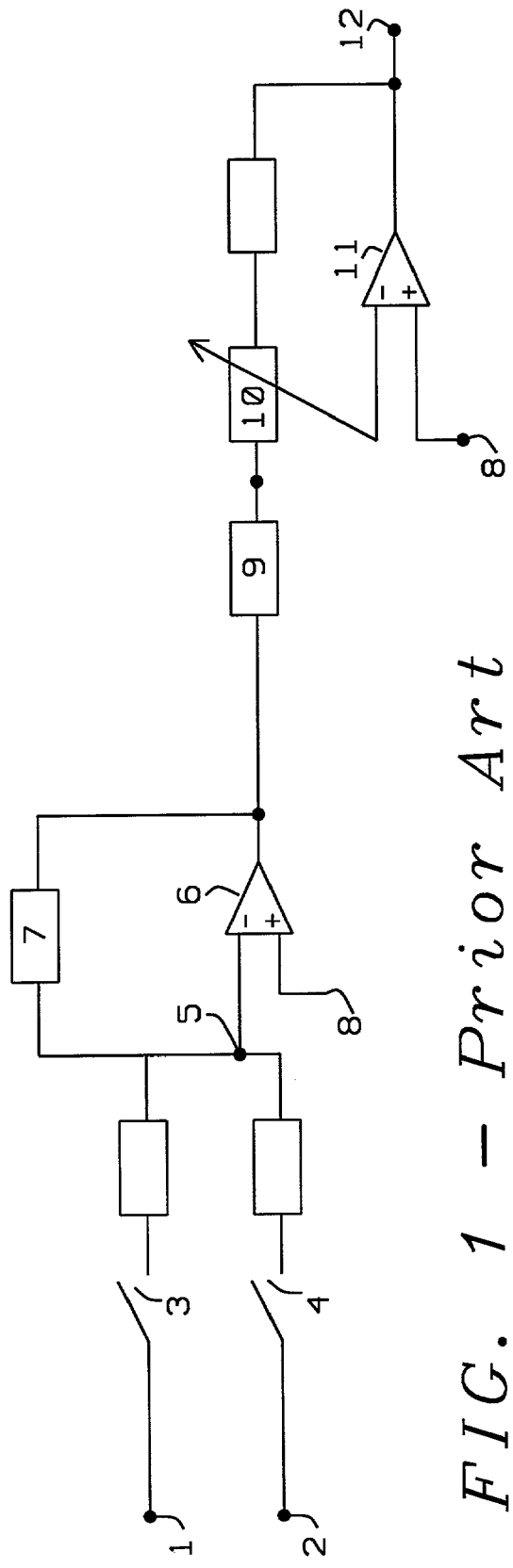
FIG. 1 – Prior Art
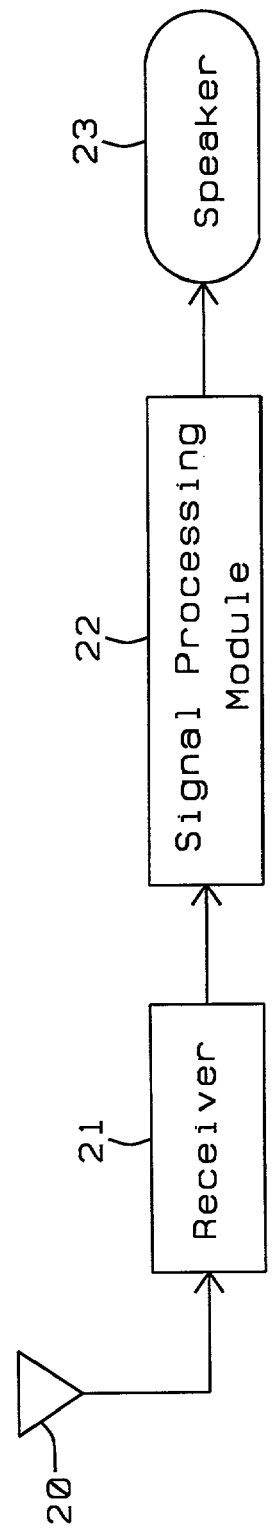
FIG. 2

AUDIO SUPERPOSITIONING

BACKGROUND OF THE INVENTION (1) Field of the Invention

The invention relates to a audio output device circuit, and more particularly, to superpositioning of different audio input channels as voice, music and ringer signals wherein said different audio signals are using a common output stage and can be heard together or separately as required.

(2) Description of the Prior Art

In prior art a summation point as input to an amplifier performs the "mixing" of different audio signals as voice, music or ringer signals. FIG. 1 shows a typical prior art implementation of the superpositioning of two audio signals as input, e.g. from a voice signal 1 and a ringer signal 2. Both input signals can be activated either separately or together by two switches 3 and 4. Point 5 is the stable point in this configuration with the property of a virtual ground. The input of the amplifier 6 comprises the summation point 5 and a reference voltage 8. Typically said reference voltage 8 is identical at each stage. The resistor 7 is controlling the gain of the amplifier 6. The resistor 9 provides the entry resistance of the following output stage comprising the amplifier II, the gain adjustment resistors 10, said reference voltage 8 and the output voltage 12 which can be used to drive a loudspeaker. It is obvious that with this configuration the offset caused by amplifier 6 will be multiplied by the gain of the output stage.

The patent application (DS01-024) by the same inventors Klaus Graef and Edgar Sexauer Ser. No. 09/995,195 filed Nov. 27,2001 describes a circuit wherein the same output stage is used for either the audio mode or the ringer mode of a mobile phone. The gain adjustment is done using amplitude setting by the same string of resistors in the audio mode as well as the ringer mode. "Mixing" or superpositioning of different audio sources is not covered and shown in cited patent application.

U.S. Pat. No. 5,541,543 to Arnaud discloses a telephone set fitted with a speech signal loudspeaker also serving as a ringer and more particularly to a device for regulating the power provided to the loudspeaker during a ring signal.

U.S. Pat. 5,894,212 to Wendt et al. shows a ring signal from a DC power supply using a pair of switches controlled by a pulse width modulation (PWM) circuit.

SUMMARY OF THE INVENTION

A principal object of the present invention is to provide a space saving and cost effective on-chip solution for audio output devices to enable superpositioning of various audio signals as voice, ringer signals or music.

A further object of the present invention is to reduce power consumption, chip area required and offset voltage and to improve PSSR.

A still object of the present invention is to provide a precise adjustment of the output signal to achieve an exact setting of the volume of devices as a loudspeaker, In accordance with the objects of this invention, a circuit with the ability to perform superpositioning of different audio signals with less amplifiers than in prior art is achieved. Said circuit for superpositioning different audio signals of a audio output device is comprising more than one audio input channels, a configuration of switches to activate different input audio signals, a configuration of resistors for each input line of audio signals and an inverting voltage amplifier as output stage to control the superpositioned audio signals having an input and an output. The input is coupled to a reference voltage and to by said switches activated superpositioned audio signals. Said output can be used to drive a loudspeaker. Said circuit comprises an entry resistor for said voltage amplifier and means of setting the gain of said amplifier of the output stage.

In accordance to further objects of the invention a circuit with the ability to perform superpositioning of different audio signals with less amplifiers than in prior art and with the ability to provide a precise adjustment of the output signal is achieved. Said circuit for superpositioning different audio signals of a audio output device is comprising more than one audio input channels, a configuration of switches to activate different input audio signals, a configuration of resistors for each input line of audio signals and an inverting voltage amplifier as output stage to control the superpositioned audio signals having an input and an output. The input is coupled to a reference voltage and to by said switches activated superpositioned audio signals. Said output can be used to drive a loudspeaker. Said output stage comprises an entry resistor for said voltage amplifier and a string of resistors and correspondent gain switches to define the setting of the amplitude of said output signal. One and only one of said gain switches is closed to define the amplitude of the output signal through the resistance of the chain of said resistors between the said gain switch closed and the output gate.

BRIEF DESCRIPTION OF THE DRAWINGS

In the accompanying drawings forming a material part of this description there is shown:

FIG. 1 Prior art illustrates a typical circuit for superpositioning of 2 different audio signals.

FIG. 2 illustrates a schematic illustration of a receive path of a wireless phone.

DESCRIPTION OF THE PREFERRED EMBODIMENTS

Figure 3:
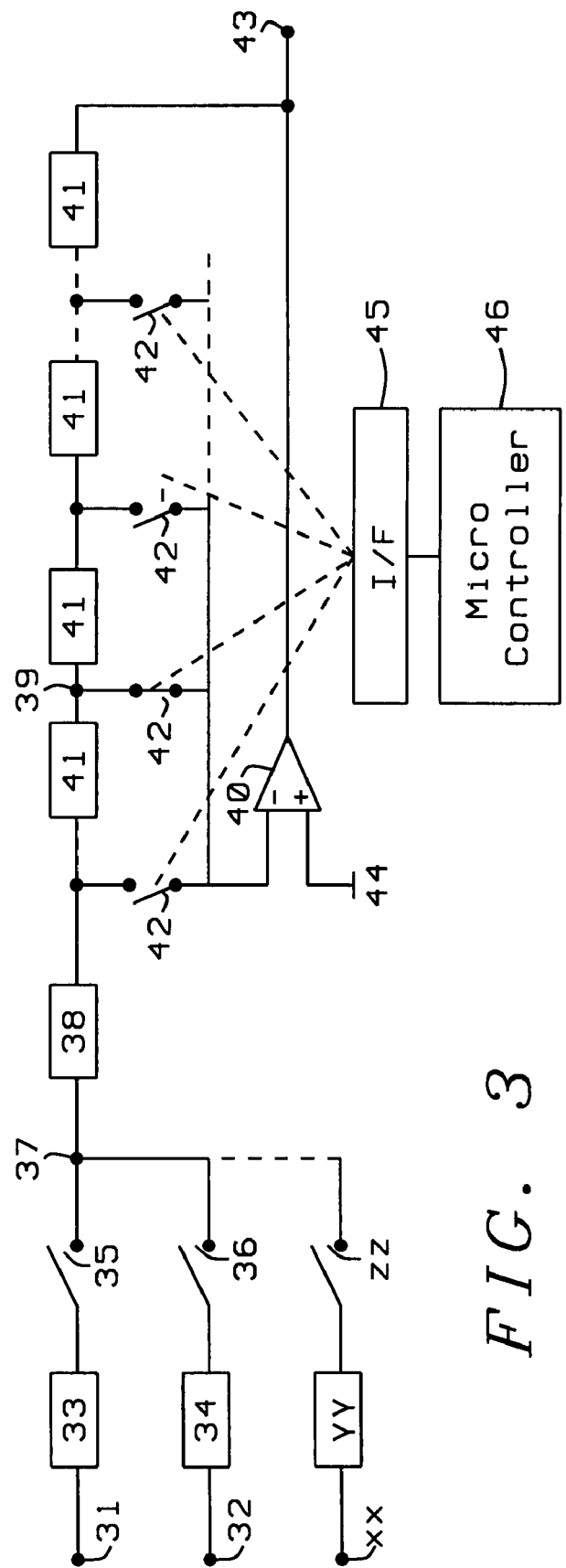
FIG. 3 illustrates a preferred embodiment of the present invention showing a circuit for superpositioning of different audio signals.

The preferred embodiments disclose a novel circuit enabling the superpositioning of different audio signals in the signal processing module of a audio output device as e.g. mobile phone. FIG. 2 shows a schematic illustration of a receive path of a mobile phone. In the shown conception of an embodiment the receive path of a mobile phone comprises the antenna 20, an RF receiver 21, a signal processing module 22 and a speaker 23. Said novel circuit of the invention enabling the superpositioning of audio signals is located in said signal processing module 22.

FIG. 3 illustrates a preferred embodiment of the invention. 31 and 32 represent two different audio input signals as e.g. music and voice, 33 and 34 represent a pair of parallel resistors, in an actual embodiment they have a resistance in the magnitude of 10 KΩ. A pair of parallel switches 35 and 36 can activate either one or both of said input audio signals. The input signal xx, the resistor yy and the switch zz represent a multitude of possible input stages of any number. In one implementation three input stages are being used for speech, music and any other audio sequence. Said three input stages can be activated at the option of the user of said audio output device. The resistance of the switches being typically in the magnitude of 100-150 Ω is small compared to the resistance of said entry resistors. The point 37 is the summation point of the different input signals for superpositioning. The resistor 38 is the entry resistor of the output stage.

The string of resistors 41 and the string of switches 42 shown in FIG. 3 represent a multitude of n resistors and related switches used for the amplitude setting of the output signal 43. Said number n of resistors and switches is much higher in reality than shown in FIG. 3. The output stage is comprising said string of resistors 41, a correspondent string of resistive gain switches 42, an inverted amplifier 40, a reference voltage 44 and the output voltage 43. Said output voltage can drive a loudspeaker (not shown in the drawing). One resistive gain switch 42 is assigned to each resistor 41.

All said resistive gain switches can be minimum in size and the tolerances in manufacturing process and temperature are not critical at all.

Said gain switches 42 are digitally programmed to ensure a faultless operation. They are controlled digitally by an external micro controller interface 46. As an example in an existing embodiment internal gain registers are used to define the gain setting. The setting of the amplitude of the output signal, e.g. to control the volume of a loudspeaker, is performed by an external micro controller 45.

For a defined amplitude setting said string of resistors 41 is used together with said string of correspondent resistive gain switches 42. The number of resistors in the string of gain resistors and the number of correspondent resistive gain switches could be any number. The more gain resistors and gain switches are used the finer will be the definition of the output signal for e.g. a loudspeaker. Only one switch of the string of said gain switches will be closed at a certain point of time to define a specific amplitude of the output signal.

The point 39 is the stable point of the circuit invented and acts as virtual ground. This point is defined by which switch is closed for a specific amplitude setting and. In FIG. 3 said point 39 is adjacent to the second switch which happens to be closed for a specific amplitude setting. The connection from said point 39 through said gain switch closed to the input of said inverted amplifier 40 has the function of a current less high impedance sense path to eliminate the parasitic effects of the resistance of the gain switch closed.

Compared to the prior art the invention needs one amplifier less for the superpositioning of different audio signals with the advantage of lower current consumption, less offset, less chip area required and a reduced power supply rejection rate (PSSR). In prior art the offset of the amplifier used for the superpositioning will be multiplied by the gain of the output stage. Avoiding the use of the mixing amplifier 6 shown in FIG. 1 prior art eliminates an offset source at the input of the loudspeaker amplifier. The reduction of the offset allows a higher dynamic range at the output of the loudspeaker amplifier 40 shown in FIG. 3 which yields in a higher output power. It reduces also the quiescent current.

As shown in the preferred embodiments, the novel circuit provides an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A circuit for superpositioning different audio signals of an audio device comprising:
    more than one audio input channels;
    a configuration of switches to activate different audio input channels;
    a configuration of resistors for each audio input channel;
    an inverting voltage amplifier, having inputs and an output, to control as output stage the superpositioned audio signals without requiring an intermediate stage amplifier wherein a first input of the inverting voltage amplifier is a reference voltage and a second input of the inverting voltage amplifier is connected to a second terminal of an entry resistor and to a means of setting a gain of said amplifier and said output, which is also connected to a means of setting the gain in a feedback loop, can be used to drive a loudspeaker;
    said entry resistor for said voltage amplifier, wherein a first terminal of said entry resistor is forming a summation point of said audio input channels; and
    said means of setting the gain of said amplifier.

2. The circuit of claim 1 wherein one audio input channel is voice and another one are ringer signals.

3. The circuit of claim 1 wherein one audio input channel is voice and another one is music.

4. The circuit of claim 1 wherein there are three or more audio input channels to be superpositioned.

5. The circuit of claim 1 wherein said audio output device is a phone.

6. The circuit of claim 1 wherein said audio output device is a CD player.

7. The circuit of claim 1 wherein said audio output device is a computing device.

8. A circuit for superpositioning different audio signals of an audio output device comprising:
    more than one audio input channels;
    a configuration of switches to activate different audio input channels;
    a configuration of resistors for each audio input channel;
    an inverting voltage amplifier, having inputs and an output, to control as output stage the superpositioned audio signals without requiring an intermediate stage amplifier, wherein a first input of the inverting amplifier is a reference voltage and a second input of the inverting voltage amplifier is connected to a second terminal of an entry resistor and to a means of setting a gain of said amplifier and said output, which is also connected to a means of setting the gain in a feedback loop, can be used to drive a loudspeaker;
    said entry resistor for said voltage amplifier, wherein a first terminal of said entry resistor is forming a summation point of said audio input channels; and
    said means of setting a gain of said amplifier comprising a string of resistors and correspondent gain switches connected to said second input of the inverting amplifier to define the setting of the amplitude of said output signal wherein one and only one of said gain switches is closed to define the amplitude of the output signal through the resistance of the chain of said resistors between the switch closed and the output gate.

9. The circuit of claim 8 wherein a current less sense path is used as input to the amplifier of the output stage to eliminate the parasitic effects of the resistance of the closed gain switch.

10. The circuit of claim 8 wherein one audio input channel is voice and another one are ringer signals.

11. The circuit of claim 8 wherein one audio input channel is voice and another one is music.

12. The circuit of claim 8 wherein there are three or more audio input channels to be superpositioned.

13. The circuit of claim 8 wherein said audio output device is a phone.

14. The circuit of claim 8 wherein said audio output device is a CD player.

15. The circuit of claim 8 wherein said audio output device is a computing device.

* * * * *